US010854265B2

(12) United States Patent
Toops

(10) Patent No.: US 10,854,265 B2
(45) Date of Patent: Dec. 1, 2020

(54) TIME TRACKING CIRCUIT FOR FRAM

(71) Applicant: TEXAS INSTRUMENTS INCORPORATED, Dallas, TX (US)

(72) Inventor: David J. Toops, Lucas, TX (US)

(73) Assignee: Texas Instruments Incorporated, Dallas, TX (US)

(*) Notice: Subject to any disclaimer, the term of this patent is extended or adjusted under 35 U.S.C. 154(b) by 0 days.

(21) Appl. No.: 16/404,118

(22) Filed: May 6, 2019

(65) Prior Publication Data

US 2019/0333561 A1 Oct. 31, 2019

Related U.S. Application Data

(63) Continuation of application No. 15/057,475, filed on Mar. 1, 2016, now Pat. No. 10,283,181.

(51) Int. Cl.
*G11C 11/22* (2006.01)

(52) U.S. Cl.
CPC ........ *G11C 11/221* (2013.01); *G11C 11/2273* (2013.01); *G11C 11/2275* (2013.01); *G11C 11/2293* (2013.01)

(58) Field of Classification Search
CPC ... G11C 11/22; G11C 11/221; G11C 11/2273; G11C 11/2275; G11C 11/2293

USPC .......................................................... 365/145
See application file for complete search history.

(56) References Cited

U.S. PATENT DOCUMENTS

| 5,798,964 | A | * | 8/1998 | Shimizu | ................. | G11C 11/22 |
| | | | | | | 365/145 |
| 6,188,599 | B1 | | 2/2001 | Kang | | |
| 8,756,558 | B2 | | 6/2014 | Toops et al. | | |
| 2004/0173867 | A1 | | 9/2004 | Beigel | | |
| 2004/0184307 | A1 | * | 9/2004 | Saito | ........................ | G11C 7/14 |
| | | | | | | 365/145 |
| 2005/0255695 | A1 | | 11/2005 | Shimada | | |
| 2005/0270886 | A1 | | 12/2005 | Takashima | | |
| 2009/0103348 | A1 | | 4/2009 | Du | | |

* cited by examiner

*Primary Examiner* — Alfredo Bermudez Lozada
(74) *Attorney, Agent, or Firm* — Brian D. Graham; Charles A. Brill; Frank D. Cimino

(57) ABSTRACT

An example memory circuit for reading and/or writing FRAM memory includes a controller to output a signal to an input of a driver; a transistor coupled an output of the driver; the driver to, in response to receiving the signal, output a first voltage to the transistor; and the transistor to, in response to receiving the first voltage, output a second voltage to a bit cell after a transistor delay, the transistor selected based on a size of the memory circuit.

20 Claims, 5 Drawing Sheets

TIME TRACKING CIRCUIT FOR FRAM

CROSS-REFERENCE TO RELATED APPLICATIONS

This application is a continuation of U.S. patent application Ser. No. 15/057,475 filed on Mar. 1, 2016, which is incorporated herein by reference.

FIELD OF THE DISCLOSURE

This disclosure relates generally to ferroelectric random access memory (FRAM) and, more particularly, to methods and apparatus of providing a time tracking circuit for FRAM.

BACKGROUND

Ferroelectric random access memory (FRAM) is a type of non-volatile memory device that includes an array of bit cells. Each FRAM bit cell includes a ferroelectric capacitor that stores charge. The charge corresponds to a logic value. The charge can be changed (e.g., written) and/or read by a memory controller. Conventional FRAM circuits contain a set number of rows and columns of bit cells (e.g., 512 rows and 72 columns). However, advances in FRAM technology have led to FRAM circuits of various numbers of rows and columns. For example, FRAM may include 32-512 rows and 8-144 columns allowing up to seventy-two thousand bits of non-volatile memory.

SUMMARY

Examples disclosed herein provide a time tracking circuit in a memory array. An example apparatus disclosed herein includes a controller to output a first signal and a second signal. Such examples includes a first driver to, in response to receiving the first signal, output a first voltage to a first transistor after a first delay corresponding to a size of the first transistor, the first transistor to output a second voltage to a plate line of a bit cell. Such examples include a second driver to, in response to receiving the second signal, output a third voltage to a to a second transistor after a second delay corresponding to a size of the second transistor, the second transistor to output the fourth voltage to a bit line of the bit cell, at least one of the first transistor or the second transistor selected based on a size of the memory.

BRIEF DESCRIPTION OF THE DRAWINGS

The figures are not to scale. Wherever possible, the same reference numbers will be used throughout the drawing(s) and accompanying written description to refer to the same or like parts.

DETAILED DESCRIPTION

Figure 1:
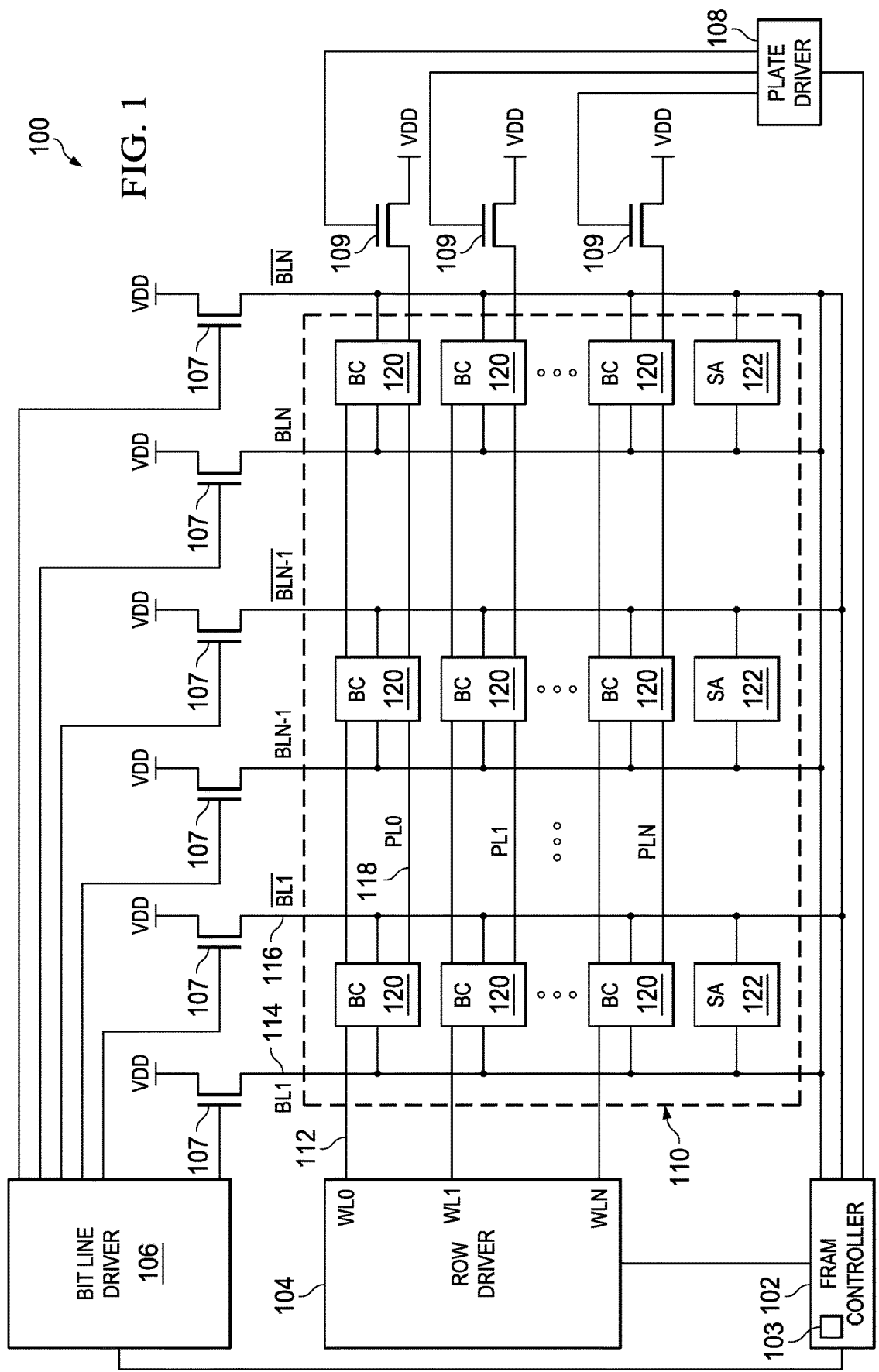
FIG. 1 is an example ferroelectric random access memory circuit to read/write to an example bit cell.

Ferroelectric random access memory (FRAM) is a non-volatile memory circuit including an array of bit cells. An FRAM bit cell includes a ferroelectric capacitor to store charge. The stored charge associated with the ferroelectric capacitor represents a binary value (e.g., "1" or "0") that can be read. Reading values in FRAM array is a destructive process (e.g., the stored value is lost once read). Thus, once a value of a bit cell in FRAM is read, the read value needs to be written back (e.g., refreshed) into the bit cell. To read and/or write a bit cell in FRAM, a delayed voltage pulse of a particular width is output by FRAM drivers (e.g., a row driver, a plate driver, and/or a bit line driver) of the FRAM. A timing circuit may be used to create such a delay. The length of the delay is associated with the minimum amount of time necessary for charge to flow through a transistor of a bit cell. As the dimensions (e.g., the number of rows and columns) of an FRAM array increases, the load and capacitance associated with the FRAM array also increases. Thus, a voltage pulse to program a larger FRAM array needs to be wider than a voltage pulse to program a smaller FRAM array. The optimal width of a pulse is associated with a minimum amount of time necessary to store sufficient charge in a ferroelectric capacitator of the bit cell of the FRAM array.

Conventional FRAM arrays were designed to include a predetermined number or rows (e.g., 512 rows) and columns (e.g., 72 columns). Advancements in FRAM technology eliminated the predetermined number of rows and/or columns for FRAM arrays. For example, zero cancellation (e.g., using a capacitor to pull charge off a floating bit line of the FRAM array) eliminated a required bit line/bit cell ratio allowing a variable number of rows to be used in an FRAM array. Additionally, smaller FRAM arrays do not need error-correcting code associated with a large number of columns allowing a variable number of columns to be used in smaller FRAM arrays. Conventional FRAM circuits utilize a voltage pulse output by drivers of the FRAM circuit. The voltage pulses correspond to a predetermined width with a predetermined delay to read and/or write the bit cells of the FRAM array, regardless of the dimensions (e.g., number of rows and columns) of the FRAM array. However, FRAM arrays with smaller dimensions (e.g., a smaller number of rows and/or columns) can operate with less delay and smaller width voltage pulses to optimize power consumption and speed. Adjusting delay and pulse width may include adjusting timing circuits of the FRAM array. However, customizing timing circuits in FRAM designs can be complicated and expensive. Examples disclosed herein alleviate the complexity and expense of designing various timing circuits.

Examples disclosed herein utilize different size transistors coupled to FRAM drivers for different size FRAM arrays. Different size transistors correspond to different delays and different pulse widths. Thus, a fixed timing circuit with a minimal delay can be used with different size transistors to add additional delay. Differed size transistors affect the loading on the FRAM drivers which affect delay and width of a voltage pulse of the drivers. The delay from the fixed timing circuit is added to the delay associated with the transistors to output a pulse with the desired delay (e.g., optimal). For example, the minimum required delay (e.g., the optimal delay) for a plate pulse to read a bit cell from a small FRAM array may be 101 nanosecond (ns), the minimum required delay for a plate pulse to read a bit cell from a medium FRAM array may be 103 ns, and a minimum required delay for a plate pulse to read a bit cell from a large FRAM array may be 105 ns. In such an example, a timing circuit creating a 100 ns delay may be used for the small, medium, and large FRAM arrays. Small transistors corresponding to 1 ns delay can be used for the small FRAM array (e.g., 100 ns+1 ns=101 ns, the minimum required delay for the small FRAM), medium transistors corresponding to a 3 ns delay can be used for the medium FRAM array (e.g., 100 ns+3 ns=103 ns, the minimum required delay for the medium FRAM), and larger transistors corresponding to a 5 ns delay can be used for the larger FRAM array (e.g., 100 ns+5 ns=105 ns, the minimum required delay for the large FRAM).

Different size transistors further correspond to different pulse widths. For example, a pulse from a driver coupled to a small transistor may correspond with applying a high voltage (e.g., 2V) for 14 ns, whereas a pulse from a driver coupled to a large transistor may correspond to applying a high voltage for 16 ns. As discussed above, smaller FRAM circuits require less pulse width to read and/or write bit cells in small FRAM arrays than to read and/or write bit cells in larger FRAM arrays. Thus, utilizing smaller transistors to meet the minimum required pulse delays of the FRAM array does not affect the ability to read and/or write the FRAM bit cells. Using examples disclosed herein, FRAM designs can be compiled to optimize power, speed, and timing margin while minimizing cost by adjusting pulse delay and pulse width through the use of different size transistors coupled to the FRAM drivers.

FIG. 1 is an example FRAM circuit 100 structured to store data. The example FRAM circuit 100 includes an example FRAM controller 102, an example row driver 104, an example bit line driver 106, example bit line transistors 107, an example plate driver 108, example plate transistors 109, and an example FRAM array 110. The example row driver 104 outputs voltage to the example FRAM array 100 via an example word line 112, the example bit line driver 106 controls the example bit line transistors 107 to output voltage (e.g., Vdd) to the example FRAM array 100 via an example bit line 114 and an example complementary bit line 116, and the example plate driver 108 controls the example plate transistors 109 to output voltage (e.g., Vdd) to the example FRAM array 100 via an example plate line 118. The example FRAM array 110 includes an example bit cell 120 and an example sense amplifier 122. The example FRAM circuit 100 is described in conjunction with two transistor two capacitor (2T-2C) bit cells. Alternatively, the example FRAM circuit 100 may include bit cells with any number of transistors and/or capacitors (e.g., 1T-1C, 6T-2C, etc.). However, such FRAM circuits 100 may be arranged (e.g., connected) slightly differently to accommodate such bit cell configurations.

The example FRAM controller 102 controls the reading and/or writing of the example bit cells (e.g., including the example bit cell 120) in the example FRAM array 110. The example FRAM controller 102 may be included in and/or coupled to an additional processor and/or computer system. The example FRAM controller 102 sends read instructions (e.g., read signals) and/or write instructions (e.g., write signals) to the example drivers 104, 106, 108 to read and/or write the example bit cells in the example FRAM array 110. In some example, the FRAM controller 102 includes a fixed timing circuit 103 to output the read signals and/or write signals after a predetermined delay. The example FRAM controller 102 also receives signals from the example sense amplifiers (e.g., including the example sense amplifier 122) identifying a logic value associated with charge stored in bit cells in the example FRAM array 110.

The example drivers (e.g., the example row driver 104, the example bit line driver 106, and the example plate driver 108) output voltages to the example FRAM array 110 in response to receiving read and/or write signals from the example FRAM controller 102. The example drivers 104, 106, 108 may include a complementary metal oxide semiconductor CMOS circuit. The example bit line driver 106 outputs a control signal to one or more of the example bit line transistors 107 to output a voltage to the example bit line 114 and the example complementary bit line 116 of the example FRAM array 110. The example plate driver 108 outputs a control signal to one or more of the example plate transistors 109 to output a voltage to the example plate line 118 of the example FRAM array 110. The example bit line transistors 107 and plate transistors 109 are metal oxide semiconductor field effect transistors (MOSFETS). Alternatively, the example bit line transistors 107 and/or the example plate transistors 109 may be any type of transistor. The example bit line transistors 107 and/or the example plate transistors 109 may be various sizes based on resistance, capacitance, and/or transconductance of the example transistors 107, 109. The size of the example transistors 107, 109 correspond to a particular delay. The particular delay is an amount of time that a particular size driver takes to output a voltage pulse in response to receiving a read/write signal (e.g., a reaction time). Additionally, the size of the example transistors 107, 109 correspond to a particular pulse width. As previously described, the example row driver 104 outputs a voltage (e.g., the example word line voltage 112) on the word lines, the example bit line driver 106 outputs voltages (e.g., the example bit line voltage 114 and the example complementary bit line voltage 116) on the bit lines and complementary bit lines via the example bit line transistors 107, and the example plate driver 108 outputs a voltage (e.g., the example plate line voltage 118) on the plate lines via the example plate transistor 109.

The example FRAM array 110 is a memory array including any number of rows and/or columns of ferroelectric bit cells. As described above, as the number or rows and/or columns decreases, the load and capacitance associated with the FRAM array 110 decreases. As both the load and capacitance decrease, voltage pulses output by the example drivers 104, 106, 108 can be optimized (e.g., optimizing power, speed, and timing margin) by narrowing the pulse width and delaying the pulse width. For example, shorter voltage pulses require less time outputting a high voltage with leads to less power consumption and faster read/write cycles. The example FRAM array 110 includes the example bit cell 120 and the example sense amplifier 122. The example bit cell 120 stores a binary (e.g., logic) value based on the voltages (e.g., the word line voltage, the bit line voltage, and the plate line voltage) applied to the example bit cell 120. As further described in FIG. 2, the example bit cell 120 may include MOSFETs each coupled to separate ferroelectric capacitors. Alternatively, the example bit cell 120 may include any number of MOSFETS and/or ferroelectric capacitors to store a binary logic value. The example sense amplifier 122 is used to read the logic value stored in the example bit cell 120. The example sense amplifier 122 may include a series of transistors configured to amplify a voltage differential between the example bit line 114 and the example complementary bit line 116 to a normal logic level. The sense amplifier 122 outputs the stored logic value of the example bit cell 120 to the example FRAM controller 102 based on the voltage differential. For example, the sense amplifier 122 may output a logic value "1" when a voltage on the example bit line 114 is higher than a voltage on the example complementary bit line 116.

In operation, when the example FRAM controller 102 executes instructions to read a logic value stored in the example bit cell 120 of the example FRAM 110, the example FRAM controller 102 sends out (e.g., transmits) read signals to the example drivers 104, 106, 108. The read signals instruct the example drivers 104, 106, 108 as to which bit cell should be read. The example FRAM controller 102 may delay some of the read signals (e.g., the read signals to the example bit line driver 106 and/or the example plate driver 108) while the voltage on the example word line 112 reaches the example bit cell 120. Once the example plate driver 108 receives the delayed read signal, the plate driver 108 outputs a voltage pulse of a particular width. The example plate transistor 109 receives the voltage pulse and further widens the pulse due to the size of the example plate transistor 109. Additionally, every plate transistor 109 contains a particular delay associated with an amount of time necessary to output a pulse after receiving a read signal. For example, a small example plate transistor 109 may output a 10 ns wide pulse with a delay of 1 ns in response to receiving a read signal. However, a large example plate transistor 109 may output a 16 ns wide pulse with a delay of 5 ns in response to receiving a read signal. The minimum amount of delay and/or pulse width is determined based on the number of columns of the example FRAM array 110. Thus, the size of the example plate transistors 109 are selected based on the column size of the example FRAM array 100.

While the example plate driver 108 outputs the plate pulse to the example plate pulse line 118 via the example plate transistor 109, the example bit line driver 106 floats (e.g., does not output voltage on) both of the example bit line 114 and the complementary bit line 116 allowing charge associated with a dipole orientation of the example bit cell 120 to discharge on either bit line 114 or complementary bit line 116. The example sense amplifier measures a voltage differential between the bit line 114 and the complementary bit line 116 to determine a logic value associated with the bit cell 120 based on the voltage differential and transmits the logic value to the example FRAM controller 102.

As described above, a read operation of the example FRAM bit cell 120 is destructive. Thus, the logic stored in the example bit cell 120 is lost once it is read. Accordingly, the example FRAM controller 102 writes-back (e.g., refreshes) the stored logic into the example bit cell 120. To write-back the stored logic, the example FRAM controller 102 sends write signals to the example drivers 104, 106, 108. The write signals instruct the example drivers 104, 106, 108 to write the previously stored value into the example bit cell 120. In some examples, the FRAM controller 102 initializes all of the bit cells of the FRAM array 110 to a logic value (e.g., either "1" or "0") prior to writing to the example bit cell 120. In such examples, the drivers 106, 109, 104 may write the stored logic if it is different from the initialized logic value.

The example FRAM controller 102 may delay the write signals (e.g., the write signals to the example bit line driver 106 and/or the example plate driver 108) while the voltage on the example word line 112 reaches the example bit cell 120. In some examples, the word line voltage may remain high from the read operation. Once the example bit line driver 108 receives the delayed write signal, the bit line driver 106 outputs a voltage pulse (e.g., either a high voltage or ground) of a particular width after a particular delay on the example bit line 114 via a first one of the example bit line transistors 107. Additionally, the voltage pulse is complemented (e.g., from the high voltage to ground or from ground to the high voltage) and output to the example complementary bit line 116 via a second one of the example bit line transistors 107. The particular width and the particular delay correspond to the size the example bit line transistors 107. For example, a small example bit line transistor 107 may output a 10 ns wide pulse with a delay of 1 ns in response to receiving the write signal. However, a large example bit line transistor 107 may output a 16 ns wide pulse with a delay of 5 ns in response to receiving a write signal. The minimum amount of delay and/or pulse width is determined based on the number or rows of the example FRAM array 110. Thus, the size of the example bit line transistors 107 are selected based on the row size of the example FRAM array 100.

While the bit line driver 106 outputs the bit line pulse and complementary bit line pulse to the example bit line pulse line 114 and the example complementary bit line pulse line 116 via the example bit line transistors 107, the plate driver 108 outputs a voltage (e.g., ground to write "1" or 2V to write "0") to the example plate line 118 via one of the example plate transistors 109 allowing one of two ferroelectric capacitors associated with the example bit cell 120 to change dipole orientation (e.g., charge). As further described in FIG. 2, the dipole orientations of the ferroelectric capacitors correspond to a logic value.

Figure 2:
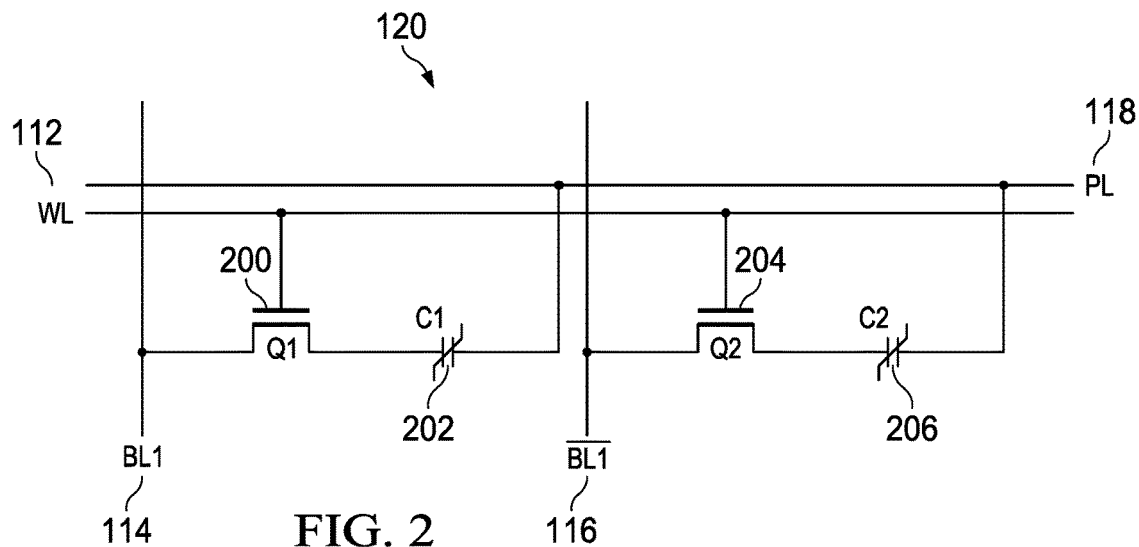
FIG. 2 is the example bit cell of FIG. 1.

FIG. 2 is an illustration of the example bit cell 120 to store a logic value. The example bit cell 120 is a 2T-2C bit cell; however, any number of transistors and/or capacitors may be utilized to store a logic value. The example bit cell 120 includes the example word line 112, the example bit line 114, the example complementary bit line 116, and the example plate line 118 of FIG. 1. The example bit cell 120 further includes example MOSFETs 200, 204 and example ferroelectric capacitors 202, 206. In some examples, the ferroelectric capacitors 202, 206 are initialized to a first (e.g., negative) dipole orientation.

During a write operation, the example row driver 104 (FIG. 1) outputs a high voltage (e.g., 2V) on the example word line 112 which is coupled to the gate of the example MOSFET Q1 200. When the high voltage is output on the example word line 112, the example MOSFETS 200, 204 act like closed switches so that the first ferroelectric capacitor 202 is coupled to the plate line 118 and the bit line 114 and the second ferroelectric capacitor 204 is coupled to the plate line 118 and the complementary bit line 114. If a "1" is to be written into the example bit cell 120, the example bit line driver 106 outputs a high voltage on the example bit line 114 and ground on the example complementary bit line 116 via the example bit line transistors 107. Additionally, the example plate driver 108 outputs ground on the example plate line 118 via the example plate transistors 109. In such an example, there will be a voltage drop across the first example ferroelectric capacitor 202 charging the ferroelectric capacitor 202 in a second (e.g., positive) dipole orientation. The second ferroelectric capacitor 206 will not charge since there is no voltage drop across it (e.g., keeping the negative dipole orientation). If a "0" is to be written into the example bit cell 120, the example bit line driver 106 outputs a ground voltage on the example bit line 114 and a high voltage on the example complementary bit line 116. Additionally, the example plate driver 108 outputs a high voltage on the example plate line 118. In such an example, there will be a voltage drop across the second example ferroelectric capacitor 206 charging the example ferroelectric capacitor 206 in the positive dipole orientation. The first example ferroelectric capacitor 202 will not charge since there is no voltage drop across it (e.g., keeping the negative dipole orientation). In such examples, a stored charge (e.g., the positive dipole orientation) in the first example ferroelectric capacitor 202 is associated with a first logic value (e.g. "1") and a stored charge (e.g., the negative dipole orientation) in the second example ferroelectric capacitor 206 is associated with a second logic value (e.g. "0").

During a read operation, the example row driver 104 (FIG. 1) outputs a high voltage (e.g., 2V) on the example word line 112 which is coupled to the gate of the example MOSFET Q1 200. When the high voltage is output on the example word line 112, the example MOSFETS 200, 204 act like closed switches so that the first ferroelectric capacitor 202 is coupled to the plate line 118 and the bit line 114 and the second ferroelectric capacitor 204 is coupled to the plate line 118 and the complementary bit line 114. The example bit line driver 106 floats (e.g., does not output) voltage on the example bit line 114 and the example complementary bit line 116. Additionally, the example plate driver 108 outputs a high voltage on the example plate line 118 via the example plate transistors 109. When the high voltage is output on the example plate line 118, the high voltage is applied to the ferroelectric capacitors 202, 206 and small charge or a large charge is discharged toward the example bit line 114 and the example complementary bit line 116 depending on a dipole orientation in the ferroelectric capacitors 202, 206. For example, if the first example ferroelectric capacitor 201 has a negative dipole orientation (e.g., not charged) and the second example ferroelectric capacitor 206 has a positive dipole orientation (e.g., charged), then applying the high plate line voltage will cause the second example ferroelectric capacitor 206 to change to a negative dipole orientation causing a large charge to by output on the example complementary bit line 116. Additionally, the first example ferroelectric capacitor 202 will output a small charge on the example bit line 114 since the dipole orientation of the ferroelectric capacitor 202 did not change. In such an example, the sense amplifier 122 (FIG. 1) measures the charge difference between the example bit line 114 and the example complementary bit line 116. If the charge on the bit line 114 is larger than the charge on the complementary bit line 116, then the sense amplifier will output a first logic value (e.g., "1" or "0") to the example memory controller 102 (FIG. 1). If the charge on the bit line 114 is smaller than the charge on the complementary bit line 116, then the sense amplifier will output a second logic value (e.g., opposite of the first value) to the example memory controller 102.

While example manners of implementing the example FRAM circuit 100 of FIG. 1 are illustrated in FIG. 1, elements, processes and/or devices illustrated in FIG. 1 may be combined, divided, re-arranged, omitted, eliminated and/or implemented in any other way. Further, the example FRAM controller 102, the example row driver 104, the example bit line driver 106, the example plate driver 108, and/or, more generally, the example FRAM circuit 100 of FIG. 1, may be implemented by hardware, machine readable instructions, software, firmware and/or any combination of hardware, machine readable instructions, software and/or firmware. Thus, for example, any of the example FRAM controller 102, the example row driver 104, the example bit line driver 106, the example plate driver 108, and/or, more generally, the example FRAM circuit 100 of FIG. 1, could be implemented by analog and/or digital circuit(s), logic circuit(s), programmable processor(s), application specific integrated circuit(s) (ASIC(s)), programmable logic device(s) (PLD(s)) and/or field programmable logic device(s) (FPLD(s)). When reading any of the apparatus or system claims of this patent to cover a purely software and/or firmware implementation, at least one of the example FRAM controller 102, the example row driver 104, the example bit line driver 106, the example plate driver 108, and/or, more generally, the example FRAM circuit 100 of FIG. 1, is/are hereby expressly defined to include a tangible computer readable storage device or storage disk such as a memory, a digital versatile disk (DVD), a compact disk (CD), a Blu-ray disk, etc. storing the software and/or firmware. Further still, the example FRAM circuit 100 of FIG. 1 includes elements, processes and/or devices in addition to, or instead of, those illustrated in FIG. 1, and/or may include more than one of any or all of the illustrated elements, processes and devices.

Figure 3:
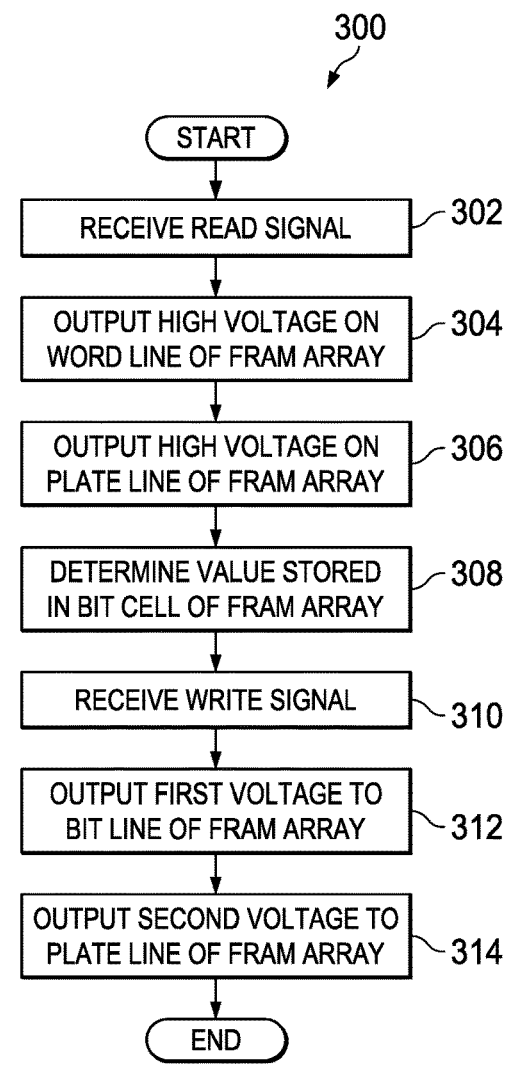
FIG. 3 is a flowchart representative of example machine readable instructions that may be executed to implement the example ferroelectric random access memory circuit of FIG. 1 to read and write the example bit cell of FIG. 1.

Flowcharts representative of example machine readable instructions for implementing the example FRAM circuit 100 of FIG. 1 is shown in FIG. 3. In the examples, the machine readable instructions comprise a program for execution by a processor such as the processor 612 shown in the example processor platform 600 discussed below in connection with FIG. 6. The program may be embodied in machine readable instructions stored on a tangible computer readable storage medium such as a CD-ROM, a floppy disk, a hard drive, a digital versatile disk (DVD), a Blu-ray disk, or a memory associated with the processor 612, but the entire program and/or parts thereof could alternatively be executed by a device other than the processor 612 and/or embodied in firmware or dedicated hardware. Further, although the example program is described with reference to the flowcharts illustrated in FIG. 3, many other methods of implementing the example FRAM circuit 100 of FIG. 1 may alternatively be used. For example, the order of execution of the blocks may be changed, and/or some of the blocks described may be changed, eliminated, or combined.

As mentioned above, the example process of FIG. 3 may be implemented using coded instructions (e.g., computer and/or machine readable instructions) stored on a tangible computer readable storage medium such as a hard disk drive, a flash memory, a read-only memory (ROM), a compact disk (CD), a digital versatile disk (DVD), a cache, a random-access memory (RAM) and/or any other storage device or storage disk in which information is stored for any duration (e.g., for extended time periods, permanently, for brief instances, for temporarily buffering, and/or for caching of the information). As used herein, the term tangible computer readable storage medium is expressly defined to include any type of computer readable storage device and/or storage disk and to exclude propagating signals and to exclude transmission media. As used herein, "tangible computer readable storage medium" and "tangible machine readable storage medium" are used interchangeably. Additionally or alternatively, the example process of FIG. 3 may be implemented using coded instructions (e.g., computer and/or machine readable instructions) stored on a non-transitory computer and/or machine readable medium such as a hard disk drive, a flash memory, a read-only memory, a compact disk, a digital versatile disk, a cache, a random-access memory and/or any other storage device or storage disk in which information is stored for any duration (e.g., for extended time periods, permanently, for brief instances, for temporarily buffering, and/or for caching of the information). As used herein, the term non-transitory computer readable medium is expressly defined to include any type of computer readable storage device and/or storage disk and to exclude propagating signals and to exclude transmission media. As used herein, when the phrase "at least" is used as the transition term in a preamble of a claim, it is open-ended in the same manner as the term "comprising" is open ended.

FIG. 3 is an example flowchart 300 representative of example machine readable instructions that may be executed by the example FRAM circuit 100 of FIG. 1 to cause the example drivers 104, 106, 108 of FIG. 1 to read and/or write bit cells of an FRAM array. Although the flowchart 300 is described in conjunction with the example FRAM circuit 100 of FIG. 1, the flowchart 300 used to implement any type of FRAM circuit.

At block 302, the example drivers 104, 106, 108 receive read signals output by the example FRAM controller 102. In some examples, the read signal sent to the example bit line driver 106 and/or the example plate driver 108 may be delayed (e.g., a fixed delay). In such examples, the FRAM controller 102 may include timing circuit 103 to generate the delay. In some examples, the read signals indicate which bit cells are to be read.

At block 304, the example row driver 104 outputs a high voltage (e.g. 2V) on the example word line 112 of the example FRAM array 110. As described above, applying a voltage on the example word line 112 enables transistors of bit cells coupled to the word line 112. After the plate driver 108 receives a fixed delay read signal from the FRAM controller 102, the plate driver 108 outputs a high voltage (e.g., 2V) on the example plate line 118 via the example plate transistors 109 (block 306). There is a second delay associated with the amount of time necessary for the plate transistors 109 to output the high voltage in response to receiving the read signal. The optimal amount of total delay (e.g., the fixed delay plus the second delay) is based on the number of columns in the example FRAM array 110. Thus, the example plate transistors 109 are selected so that the second delay (e.g., the delay associated with the example plate transistors 109) corresponds to the optimal delay (e.g., the second delay that equals the optimal delay minus the fixed delay).

At block 308, the example sense amplifier determines a logic value stored in the example bit cell 120 (e.g., corresponding to the example word line 112 and the example plate line 118). As described in FIG. 2, the example sense amplifier 120 determines the logic value based on a charge difference between the example bit line 114 and the example complementary bit line 116. As described above, the read operation of the example FRAM array 110 is destructive. Thus, once the example bit cell 120 has been read, the example FRAM controller 102 transmits write signals to the example drivers 104, 106, 108 to write-back to the example bit cell 120. In some examples, the read signals transmitted by the FRAM controller 102 include instructions to write-back (e.g., refresh) the stored logic value after a read operation. In such an example, the write signals may not be necessary (e.g., the write operation automatically follows a read operation). If the write operation is a write-back operation following a read operation, the example row driver 104 may continue outputting the high voltage on the example word line 112.

At block 310, the example drivers 104, 106, 108 receive the example write signals. In some examples, the write signal sent to the example bit line driver 106 and/or the example plate driver 108 may be delayed (e.g., a fixed delay). In such examples, the FRAM controller 102 may include timing circuit 103 to generate the delay. In some examples, the write signals indicate which bit cells are to be written to.

At block 312, the example bit line driver 106 outputs a first voltage (e.g. either 2V or ground) on the example bit line 114 of the example FRAM array 110 via a first one of the example bit line transistors 107, depending on which value (e.g., "1" or "0") is to be stored. When the example bit line driver 106 outputs the first voltage on the example bit line, the example bit line driver 106 also outputs a second complimentary voltage on the example complementary bit line 116 via a second one of the example bit line transistors 108. For example, if the voltage on the example bit line 114 is 2V, the voltage on the example complementary bit line 116 will be ground. There is a second delay associated with an amount of time necessary for the bit line transistors 107 to output the first voltage in response to receiving the write signal. The optimal amount of total delay (e.g., the fixed delay plus the second delay) is based on the number of rows in the example FRAM array 110. Thus, the example bit line transistor 107 is selected so that the second delay (e.g., the delay associated with the example bit line transistor 107) corresponds to the optimal delay (e.g., the second delay should equal the optimal delay minus the fixed delay).

At block 314, the example plate driver 108 outputs a plate pulse voltage (e.g., 2V) on the example plate line 118 of the example FRAM array 110 via one of the example plate transistors 109. As described in FIG. 2, the plate pulse voltage causes a voltage differential (e.g., switching the dipole orientation) between (A) the example plate line 118 and the example bit line 114 or (B) the example plate line 118 and the example complementary bit line 116. The direction of the dipole orientation (e.g., positive or negative) of the example ferroelectric capacitors 202, 204 corresponds to a stored logic value.

Figure 4:
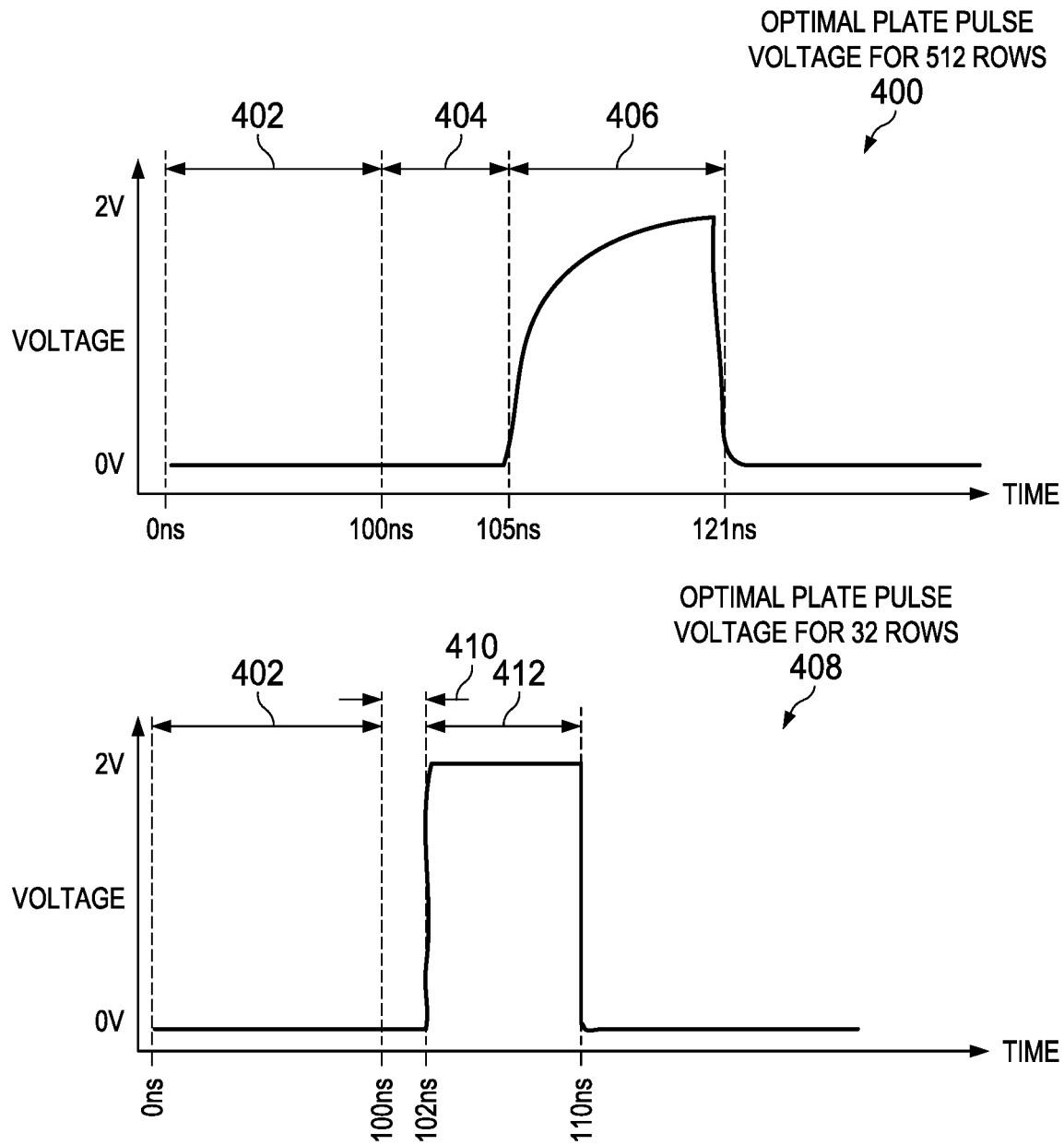
FIG. 4 illustrates two example timing diagrams for an example driver pulse output by an example plate driver of FIG. 1.

FIG. 4 illustrates a timing diagram comparison of an optimal plate pulse voltage for an FRAM array with 512 rows and an optimal plate pulse voltage for an FRAM array with 32 rows. The illustrated timing diagrams include an example plate pulse voltage for 512 rows 400 associated with an example fixed timing delay 402, an example first plate transistor pulse delay 404, and an example first plate pulse width 406. The illustrated timing diagrams also include an example plate pulse voltage for 32 rows 408 associated with the example fixed timing delay 402, an example second plate transistor pulse delay 410, and an example second plate pulse width 412.

As described above, the optimal plate pulse delay is the minimum amount of delay necessary to successfully read/write a logic value from/to the example bit cell 120 of the example FRAM array 110. In some examples, the optimal plate pulse delay is acquired from a look-up table and/or generated based on FRAM testing. The example fixed delay 402 is a delay associated with the timing circuit 103 of the example FRAM controller 102. In some examples, the fixed delay 402 is a predetermined amount of time that does not change based on different sized FRAM arrays 110. The fixed delay 402 is less than the optimal plate pulse delay so that a delay associated with the plate transistor (e.g., one of the example plate transistors 109) can be added to the fixed delay to total the optimal plate pulse delay. In this manner, an optimal delay can be achieved for different sized FRAM arrays by adjusting the transistor sizes and not adjusting the fixed timing circuit 103. For example, the optimal delay for the example plate pulse for 512 rows 400 is 105 ns. To achieve the 105 ns optimal delay, a large pulse transistor with the first example delay 404 (e.g., 5 ns) is selected (e.g., 100 ns fixed delay+5 ns pulse transistor delay=105 ns optimal delay). Additionally, the optimal delay for the example plate transistor pulse for 32 rows 408 is 102 ns. To achieve the 102 ns optimal delay, a small transistor with the second example delay 410 (e.g., 2 ns) is selected (e.g., 100 ns fixed delay+2 ns pulse transistor delay=102 ns optimal delay).

As described above, the optimal plate pulse width is the minimum plate pulse width (e.g., the amount of time the plate pulse is high) necessary to successfully read/write a logic value from/to the example bit cell 120 of the example FRAM array 110. As the number of rows in the FRAM array 110 increases, the amount of capacitance corresponding to the FRAM array 110 increases and the plate pulse takes longer to reach a minimum voltage necessary to successfully read/write a logic value from/to the example bit cell 120. Thus, the plate pulse width for FRAM arrays with more rows needs to be wider in order to allow sufficient time for the plate pulse to reach the sufficient voltage to program the example bit cell 120. In some examples, the optimal plate pulse width is acquired from a look-up table and/or generated based on FRAM testing. In the example plate pulse voltage for 512 rows 400, the optimal plate pulse width 406 is 16 ns. In the example plate pulse voltage for 32 rows 408, the optimal plate pulse width 412 is 8 ns.

Figure 5:
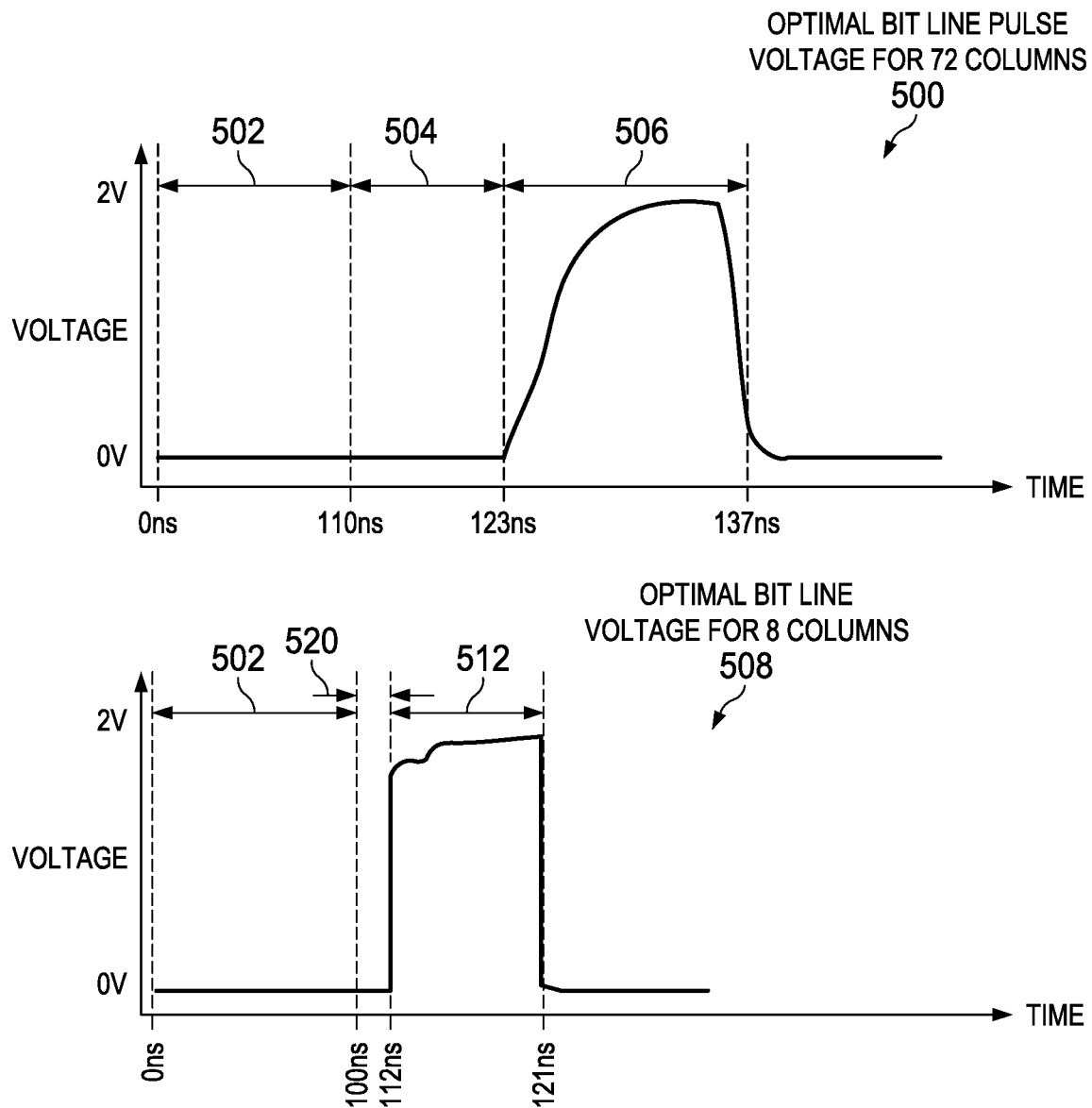
FIG. 5 illustrates two example timing diagrams for an example driver pulse output by an example write-back driver of FIG. 1.

FIG. 5 illustrates a timing diagram comparison of an optimal bit line transistor pulse voltage for an FRAM array with 72 columns and a bit line transistor pulse voltage for an FRAM array with 8 columns. The illustrated timing diagrams include an example bit line transistor voltage for 72 columns 500 associated with an example fixed timing delay 502, an example first bit line transistor delay 504, and an example first bit line pulse width 506. The illustrated timing diagrams also include an example bit line transistor pulse voltage for 8 columns 508 associated with the example fixed timing delay 502, an example second bit line transistor delay 510, and an example second bit line pulse width 512.

As described above, the optimal bit line pulse delay is the minimum amount of delay necessary to successfully write a logic value to the example bit cell 120 of the example FRAM array 110. In some examples, the optimal bit line pulse delay is acquired from a look-up table and/or generated based on FRAM testing. The example fixed delay 502 is a delay associated with the timing circuit 103 of the example FRAM controller 102. In some examples, the example fixed delay 502 is a predetermined amount of time that does not change based on different sized FRAM arrays 110. In such examples, the fixed delay 502 is less than the optimal bit line pulse delay so that a delay associated with the bit line transistor (e.g., the example bit line transistors 107 of FIG. 1) can be added to the fixed delay to total the optimal bit line pulse delay. In this manner, an optimal delay can be achieved for different sized FRAM arrays by adjusting the transistor size and not adjusting the fixed timing circuit 103. For example, the optimal delay for the example bit line pulse for 72 columns 500 is 123 ns. To achieve the 123 ns optimal delay, a large pulse transistor with the first example delay 504 (e.g., 13 ns) is selected (e.g., 110 ns fixed delay+13 ns bit line transistor delay=123 ns optimal delay). Additionally, the optimal delay for the example bit line pulse for 8 columns 508 is 112 ns. To achieve the 102 ns optimal delay, a small transistor with the second example delay 510 (e.g., 2 ns) is selected (e.g., 110 ns fixed delay+2 ns bit line pulse transistor delay=112 ns optimal delay). In some examples, the fixed delay 502 is the same amount of delay as the example fixed delay 402 of FIG. 4. Alternatively, the example fixed delay 502 and the example fixed delay 402 may correspond to different amounts of time.

As described above, the optimal bit line pulse width is the minimum bit line pulse width (e.g., the amount of time the bit line pulse is high) necessary to successfully write a logic value from the example bit cell 120 of the example FRAM array 110. As the number of columns in the FRAM array 110 increase, the amount of capacitance corresponding to the FRAM array 110 increases and the bit line pulse takes longer to reach a minimum voltage to successfully write a logic value to the example bit cell 120. Thus, the bit line pulse width for FRAM arrays with more columns needs to be wider in order to allow sufficient time for the bit line pulse to reach the sufficient voltage to program the example bit cell 120. In some examples, the optimal bit line pulse width is acquired from a look-up table and/or generated based on FRAM testing. For example, the optimal pulse width 506 for the example plate pulse voltage for 72 columns 500 is 14 ns. The optimal pulse width 512 for the example plate pulse voltage for 8 columns 508 is 9 ns.

Figure 6:
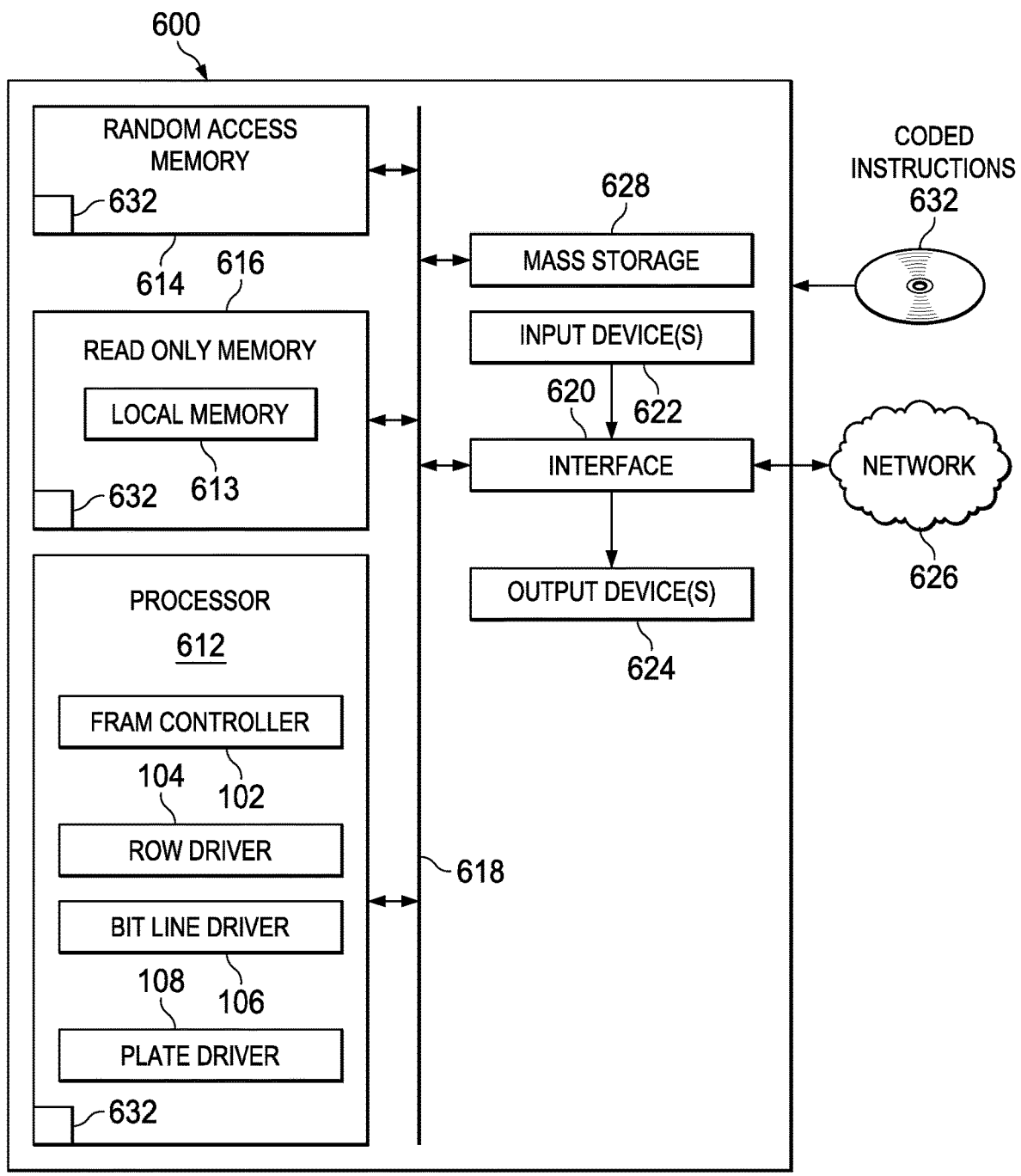
FIG. 6 is a block diagram of an example processor platform that may be utilized to execute the example instructions of FIG. 3 to implement the example ferroelectric random access memory circuit of FIG. 1.

FIG. 6 is a block diagram of an example processor platform 600 capable of executing the instructions of FIG. 3 to implement the example FRAM circuit 100 of FIG. 1. The processor platform 600 can be, for example, a server, a personal computer, a mobile device (e.g., a cell phone, a smart phone, a tablet such as an iPad™), a personal digital assistant (PDA), an Internet appliance, or any other type of computing device.

The processor platform 600 of the illustrated example includes a processor 612. The processor 612 of the illustrated example is hardware. For example, the processor 612 can be implemented by integrated circuits, logic circuits, microprocessors or controllers from any desired family or manufacturer.

The processor 612 of the illustrated example includes a local memory 613 (e.g., a cache). The example processor 612 of FIG. 6 executes the instructions of FIG. 3 to implement the example FRAM controller 102, the example row driver 104, the example bit line driver 106, and the example plate driver 108 of FIG. 1 to implement the example FRAM circuit 100. The processor 612 of the illustrated example is in communication with a main memory including a volatile memory 614 and a non-volatile memory 616 via a bus 618. The volatile memory 614 may be implemented by Synchronous Dynamic Random Access Memory (SDRAM), Dynamic Random Access Memory (DRAM), RAMBUS Dynamic Random Access Memory (RDRAM) and/or any other type of random access memory device. The non-volatile memory 616 may be implemented by flash memory and/or any other desired type of memory device. Access to the main memory 614, 616 is controlled by a clock controller.

The processor platform 600 of the illustrated example also includes an interface circuit 620. The interface circuit 620 may be implemented by any type of interface standard, such as an Ethernet interface, a universal serial bus (USB), and/or a PCI express interface.

In the illustrated example, one or more input devices 622 are connected to the interface circuit 620. The input device(s) 622 permit(s) a user to enter data and commands into the processor 612. The input device(s) can be implemented by, for example, a sensor, a microphone, a camera (still or video), a keyboard, a button, a mouse, a touchscreen, a track-pad, a trackball, isopoint and/or a voice recognition system.

One or more output devices 624 are also connected to the interface circuit 620 of the illustrated example. The output devices 624 can be implemented, for example, by display devices (e.g., a light emitting diode (LED), an organic light emitting diode (OLED), a liquid crystal display, a cathode ray tube display (CRT), a touchscreen, a tactile output device, and/or speakers). The interface circuit 620 of the illustrated example, thus, typically includes a graphics driver card, a graphics driver chip or a graphics driver processor.

The interface circuit 620 of the illustrated example also includes a communication device such as a transmitter, a receiver, a transceiver, a modem and/or network interface card to facilitate exchange of data with external machines (e.g., computing devices of any kind) via a network 626 (e.g., an Ethernet connection, a digital subscriber line (DSL), a telephone line, coaxial cable, a cellular telephone system, etc.).

The processor platform 600 of the illustrated example also includes one or more mass storage devices 628 for storing software and/or data. Examples of such mass storage devices 628 include floppy disk drives, hard drive disks, compact disk drives, Blu-ray disk drives, RAID systems, and digital versatile disk (DVD) drives.

The coded instructions 300 of FIG. 3 may be stored in the mass storage device 628, in the volatile memory 614, in the non-volatile memory 616, and/or on a removable tangible computer readable storage medium such as a CD or DVD.

From the foregoing, it would be appreciated that the above disclosed method, apparatus, and articles of manufacture provide a time tracking circuit for FRAM. Improvements in FRAM technology have led to FRAM with varying dimensions. Smaller FRAM correspond to a smaller load and smaller capacitance. Thus, voltage pulses to read/write bit cells in smaller FRAM array may include a smaller width pulse with less delay than voltage pulses associated with larger FRAM circuits. Decreasing the pulse width and delay conserve power and optimize speed of FRAM circuits. However, creating various timing circuits for various sized FRAM arrays can be time consuming and expensive. Example disclosed herein utilize (A) a fixed timing circuit associated with a fixed delay and (B) different size transistors coupled to FRAM drivers associated with different transistor delays to output a voltage pulse with an optimal delay and width. For example, both smaller and larger FRAM circuits include the same timing circuit; however, smaller FRAM circuits will include smaller transistors and larger FRAM circuits will include larger transistors. In this manner, different size FRAM circuits can output the optimal delay by selecting a transistor to couple to an FRAM driver with a corresponding transistor delay without the time and cost associated with creating a custom timing circuit. Further, selecting smaller transistors for smaller FRAM circuits create narrower pulse widths. However, smaller FRAM circuits can operate with narrower pulse widths since smaller FRAM have less capacitance than larger FRAM.

Conventional techniques for providing time tracking circuits for FRAM arrays utilized a fixed timing delay for all FRAM circuits, regardless of the dimensions of the FRAM circuit. Such conventional techniques generate delays and pulse widths required to program a maximum sized FRAM array (e.g., FRAM with 72,000 bits). Thus, delays and pulse widths for smaller FRAM arrays (e.g., FRAM with less than 72,000 bits) consumer more power and are slower then techniques described herein. By using example disclosed herein, FRAM power and speed are optimized by selecting transistors associated with an optimal pulse delay and width.

Example memory circuits are disclosed to provide time tracking for memory arrays. Such memory circuits include a controller to output a signal to an input of a driver. Such memory circuits include a transistor coupled an output of the driver. In such memory circuits, the driver is to, in response to receiving the signal, output a first voltage to the transistor. In such examples, the transistor is to, in response to receiving the first voltage, output a second voltage to a bit cell after a transistor delay, the transistor selected based on a size of the memory circuit.

In some example memory circuits, the controller is structured to output the signal after a predetermined delay. In some example memory circuits, the transistor is structured to output the second voltage to the plate line of the bit cell. In some example memory circuits, a sum of the transistor delay and the predetermined delay is approximately an optimal read delay. In some example memory circuits, the optimal read delay corresponds to a minimum amount of delay time necessary to read a logic value stored in the bit cell. Some example memory circuits further include a ferroelectric random access memory (FRAM) array, the minimum amount of delay corresponding to a number of bit cell rows in the FRAM array, wherein increasing the number of rows increases the minimum amount of delay.

In some example memory circuits, the second voltage is a second voltage pulse, wherein the transistor is further selected based on a width of the second voltage pulse, the width being a minimum width necessary to read or write a logic value in the bit cell. Some example memory circuits the transistor is structured to output the second voltage to a bit line of the bit cell. In some example memory circuits, a sum of the transistor delay and the predetermined delay is approximately an optimal write delay. In some example memory circuits, the optimal write delay corresponds to a minimum amount of delay time necessary to write a logic value to the bit cell. Some example memory circuits further include an FRAM array, the minimum amount of delay corresponding to a number of bit cell columns in the FRAM array, wherein increasing the number of columns increases the minimum amount of delay.

In some example memory circuits, the second voltage is a second voltage pulse, wherein the transistor is further selected based on a width of the second voltage pulse, the width being a minimum width necessary to write a logic value in the bit cell. In some example memory circuits, the controller includes a timing circuit to generate the predetermined delay. In some example memory circuits, the bit cell includes a ferroelectric capacitor. In some example memory circuits the transistor is structured to output the second voltage to program the bit cell with a logic value by charging the ferroelectric capacitor. In some example memory circuits, the transistor is structured to output the second voltage to read a logic value of the bit cell by discharging the ferroelectric capacitor. In some example memory circuits, the transistor delay corresponds to an amount of time for the transistor to output the second voltage in response to receiving the first voltage, the transistor delay corresponding to a size of the transistor.

Although certain example methods, apparatus and articles of manufacture have been described herein, the scope of coverage of this patent is not limited thereto. On the contrary, this patent covers all methods, apparatus and articles of manufacture fairly falling within the scope of the claims of this patent.

What is claimed is:
1. A system comprising:
 a memory circuit comprising:
  a ferroelectric random access memory (FRAM) array comprising:

a plurality of bit cells, each of the plurality of bit cells including at least one ferroelectric capacitor;
a set of word line inputs coupled to the plurality of bit cells; and
a set of plate line inputs coupled to the ferroelectric capacitors of the plurality of bit cells, wherein the FRAM array has a minimum amount of delay between assertion of a word line signal on the set of word line inputs and assertion of a plate line signal on the set of plate line inputs to enable a read of or a write to respective ones of the plurality of bit cells, the minimum amount of delay based on a number of bit cell columns in the FRAM array;
a controller that includes a plate line driver output to provide a first driver signal a first delay after assertion of the word line signal, wherein the controller includes a timing circuit to generate the first driver signal after the first delay;
a plate line driver that includes an input coupled to the plate line driver output of the controller to receive the first driver signal and a set of outputs to provide a set of plate line control signals in response to the first driver signal; and
a set of transistors coupled to the set of outputs of the plate line driver and to the set of plate line inputs of the FRAM array, wherein each transistor of the set of transistors includes:
a gate terminal coupled to a respective output of the set of outputs of the plate line driver;
a second terminal coupled to a respective plate line input of the set of plate line inputs of the FRAM array; and
a third terminal coupled to a voltage source, wherein each transistor of the set of transistors is configured to have a transistor delay such that a respective plate line control signal is received at the gate terminal at a second delay that is less than the minimum amount of delay after assertion of the word line signal and the transistor provides a plate line signal to the respective plate line input of the set of plate line inputs of the FRAM array at least the minimum amount of delay after assertion of the word line signal.

2. The system of claim 1, wherein:
the FRAM array further has a minimum pulse width for the plate line signals based on the number of bit cell columns in the FRAM array, and
each transistor of the set of transistors is further configured to provide the respective plate line signal having a width that is at least the minimum pulse width.

3. The system of claim 1, wherein:
the set of transistors is a first set of transistors;
the FRAM array further includes a set of bit line inputs coupled to the plurality of bit cells;
the FRAM array has a minimum amount of bit line delay between assertion of the word line signal and assertion of a bit line signal on the set of bit line inputs;
the controller further includes a bit line driver output to provide a second driver signal; and
the memory circuit further comprises:
a bit line driver that includes an input coupled to the bit line driver output to receive the second driver signal and a set of outputs to provide a set of bit line control signals in response to the second driver signal; and
a second set of transistors coupled to the set of outputs of the bit line driver and to the set of bit line inputs of the FRAM array.

4. The system of claim 3, wherein each transistor of the second set of transistors includes:
a gate terminal coupled to a respective output of the set of outputs of the bit line driver;
a second terminal coupled to a respective bit line input of the set of bit line inputs of the FRAN'l array; and
a third terminal coupled to the voltage source.

5. The system of claim 4, wherein each transistor of the second set of transistors is configured to have a transistor delay such that a respective bit line control signal is received at the gate terminal at a third delay that is less than the minimum amount of bit line delay after assertion of the word line signal and the transistor provides a bit line signal to the respective bit line input of the set of bit line inputs of the FRAM array at least the minimum amount of bit line delay after assertion of the word line signal.

6. The system of claim 3, wherein each of the plurality of bit cells includes:
a first ferroelectric capacitor coupled to a respective plate line input of the set of plate line inputs;
a first transistor coupled between the first ferroelectric capacitor and a first bit line of the set of bit line inputs;
a second ferroelectric capacitor coupled to the respective plate line input; and
a second transistor coupled between the second ferroelectric capacitor and a second bit line of the set of bit line inputs.

7. The system of claim 1, wherein the set of transistors provides the plate line signals to the set of plate line inputs of the FRAM array as part of a read operation.

8. The system of claim 1, wherein the set of transistors provides the plate line signals to the set of plate line inputs of the FRAM array as part of a write operation.

9. A memory circuit comprising:
a capacitive memory array that includes:
a plurality of cells that each include a respective capacitor;
a set of word line inputs coupled to the plurality of cells; and
a set of plate line inputs coupled to the capacitors of the plurality of cells;
a controller that includes a plate line driver output to provide a first driver signal;
a plate line driver that includes an input coupled to the plate line driver output of the controller to receive the first driver signal and a set of outputs to provide a set of plate line control signals;
a set of transistors coupled to the set of outputs of the plate line driver and to the set of plate line inputs of the capacitive memory array, wherein:
each of the set of transistors is configured to provide a voltage to a respective plate line input of the set of plate line inputs of the capacitive memory array in response to a respective plate line control signal of the set of plate line control signals; and
each of the set of transistors has a delay such that the respective transistor is configured to receive the respective plate line control signal at a first time that is less than a minimum amount of plate line delay after assertion of a signal at a respective word line input of the set of word line inputs and to provide the voltage to the respective plate line input at a second time that is at least the minimum amount of plate line delay after assertion of the signal at the respective word line input;

wherein the minimum amount of plate line delay is a minimum delay to enable a read of or a write to respective ones of the plurality of cells.

10. The memory circuit of claim 9, wherein each of the set of transistors includes:

a gate terminal coupled to a respective output of the set of outputs of the plate line driver;

a second terminal coupled to a respective plate line input of the set of plate line inputs of the capacitive memory array; and a third terminal coupled to a voltage source.

11. The memory circuit of claim 9, wherein:

the set of transistors is a first set of transistors;

the capacitive memory array further includes a set of bit line inputs coupled to the plurality of cells;

the controller further includes a bit line driver output to provide a second driver signal; and the memory circuit further includes:

a bit line driver that includes an input coupled to the bit line driver output of the controller to receive the second driver signal and a set of outputs to provide a set of bit line control signals; and a second set of transistors coupled to the set of outputs of the bit line driver and to the set of bit line inputs of the capacitive memory array.

12. The memory circuit of claim 11, wherein:

each of the second set of transistors is configured to provide a voltage to a respective bit line input of the set of bit line inputs of the capacitive memory array in response to a respective bit line control signal of the set of bit line control signals; and each of the second set of transistors has a delay such that the respective transistor is configured to receive the respective bit line control signal at a third time that is less than a minimum amount of bit line delay after assertion of a signal at a respective word line input of the set of word line inputs and to provide the voltage to the respective bit line input at a fourth time that is at least the minimum amount of bit line delay after assertion of the signal at the respective word line input.

13. The memory circuit of claim 11, wherein each of the second set of transistors includes:

a gate terminal coupled to a respective output of the set of outputs of the bit line driver;

a second terminal coupled to a respective bit line input of the set of bit line inputs of the capacitive memory array; and a third terminal coupled to a voltage source.

14. The memory circuit of claim 9, wherein the set of transistors provide the voltages to the set of plate line inputs of the capacitive memory array as part of a read operation.

15. The memory circuit of claim 9, wherein the set of transistors provide the voltages to the set of plate line inputs of the capacitive memory array as part of a write operation.

16. A device comprising:

a capacitive memory controller that includes a word line output, a bit line output, and a plate line output;

a row driver that includes an input coupled to the word line output of the capacitive memory controller and a set of outputs to provide a set of word line control signals;

a bit line driver that includes an input coupled to the bit line output of the capacitive memory controller and a set of outputs to provide a set of bit line control signals;

a first set of transistors coupled to the set of outputs of the bit line driver and configured to provide a set of bit line signals at a set of bit lines of a capacitive memory array;

a plate line driver that includes an input coupled to the plate line output of the capacitive memory controller and a set of outputs to provide a set of plate line control signals; and a second set of transistors coupled to the set of outputs of the plate line driver and configured to provide a set of plate line signals at a set of plate lines of the capacitive memory array, wherein:

the capacitive memory controller and the bit line driver are configured to provide the set of bit line control signals to the first set of transistors at a first time that is less than a minimum bit line delay of the capacitive memory array; and the first set of transistors are configured to provide the set of bit line signals at a second time that is at least the minimum bit line delay of the capacitive memory array;

wherein the minimum bit line delay is a minimum amount of delay between assertion of a word line control signal on the row driver outputs and assertion of a bit line control signal on the bit driver outputs to enable a read of or a write to the capacitive memory array.

17. The device of claim 16, wherein:

the capacitive memory controller and the plate line driver are configured to provide the set of plate line control signals to the second set of transistors at a third time that is less than a minimum plate line delay of the capacitive memory array; and the second set of transistors are configured to provide the set of plate line signals at a fourth time that is at least the minimum plate line delay of the capacitive memory array.

18. The device of claim 16, wherein each of the first set of transistors includes:

a gate terminal coupled to a respective output of the set of outputs of the bit line driver;

a second terminal configured to couple to a respective plate line of the set of bit lines of the capacitive memory array; and a third terminal coupled to a voltage source.

19. The device of claim 16, wherein each of the second set of transistors includes:

a gate terminal coupled to a respective output of the set of outputs of the plate line driver;

a second terminal configured to couple to a respective plate line of the set of plate lines of the capacitive memory array; and a third terminal coupled to a voltage source.

20. The device of claim 16, wherein the first set of transistors and the second set of transistors are configured to provide the set of bit line signals and the set of plate line signals as part of an operation from a group consisting of: a read operation and a write operation.

* * * * *